METHOD OF PLATINUM DIFFUSION

Filed March 31, 1971 2 Sheets-Sheet 1

INVENTOR.
JIRI SANDERA

BY Spensley, Horn & Lubitz
ATTORNEYS

INVENTOR.
JIRI SANDERA
BY
Spensley, Horn & Lubitz
ATTORNEYS

United States Patent Office 3,783,049

Patented Jan. 1, 1974

3,783,049
METHOD OF PLATINUM DIFFUSION

Jiri Sandera, Manhattan Beach, Calif., assignor to TRW Inc., Lawndale, Calif.

Filed Mar. 31, 1971, Ser. No. 129,859
Int. Cl. H01l 7/34
U.S. Cl. 148—188 15 Claims

ABSTRACT OF THE DISCLOSURE

A method for providing a controlled degradation of minority carrier lifetime in a silicon semiconductor crystal body employing $H_2P_t\,[OH]_6$ as a source of platinum. One gram of $H_2P_t\,[OH]_6$ is dissolved in 130 cc. of anhydrous acetone. Approximately 0.05 cc. of this solution is placed on the surface of a silicon semiconductor crystal body. The solution is dried and the body is then heated to the platinum diffusion temperature for a time sufficient to have platinum atoms uniformly distributed throughout the active portion of the silicon crystal.

BACKGROUND OF THE INVENTION

Field of the invention

The field of this invention is for a method to control the minority carrier lifetime of a semiconductor crystal body employed in an electrical translating device and more particularly to an improved method for providing a source of platinum atoms as a lifetime control agent.

Prior art

It has heretofore been known to employ certain lifetime control agents such as gold to be diffused into a semiconductor crystal body. It has also been known to employ platinum for such a purpose. Heretofore, the technique for providing the source of the lifetime killing atoms has generally involved the deposition of gold onto the surface of the semiconductor crystal body whose minority carrier lifetime is to be controlled. Likewise, platinum and other lifetime killers have also been similarly so used. The technique for depositing the lifetime killer onto the surface of the semiconductor crystal body by such prior art techniques is generally expensive and time consuming and also does not provide as controlable a source of lifetime Pt as is desired. Additionally such prior art methods require the use of expensive equipment such as evaporators, sputtering chambers, or plating equipment.

SUMMARY OF THE INVENTION

The present invention provides a simplified and reliable process for providing a source of platinum atoms for diffusion into a semiconductor crystal body to control the minority carrier lifetime thereof. It involves the preparation of a solution of a platinum bearing compound dissolved in a solvent having a concentration of platinum sufficient to affect the lifetime of the semiconductor upon the subsequent diffusion therein of platinum.

In accordance with the presently preferred embodiment of the invention, a dilute solution of hexahydroxy platinic acid ($H_2P_t[OH]_6$) in acetone is employed as a source of platinum to carry out the invention method as follows: One gram of the acid is dissolved in 130 cc. of anhydrous acetone. Approximately 0.05 cc. of this solution is dispersed, as by spraying, on the surface of a semiconductor slice which contains a PN junction. The semiconductor is dried in an oven at 50° to 100° C. and then baked at a high temperature causing the acid to decompose and the platinum to diffuse into the semiconductor material. Maintaining the temperature for some time allows the platinum to diffuse evenly throughout the body of the semiconductor wafer. As one typical example, a high voltage fast switching planar silicon diode was made using the presently preferred mebodiment of the invention in which a temperature of 960° C. for 30 minutes was used in the diffusion step.

It is an object of the present invention to provide a new method for introducing platinum as a lifetime control element in silicon semiconductor electrical translating devices.

A further object of the present invention is to provide an improved method for providing a source of platinum for use as a lifetime control element for semiconductor electrical translating elements.

The novel features which are believed to be characteristic of the invention both as to its organization and method of operation together with further objects and advantages thereof will be understood from the following description considered in connection with the accompanying drawings in which a presently preferred embodiment of the invention is illustrated by way of example.

DESCRIPTION OF THE DRAWING

In the drawing:

Referring now to FIGS. 1–3, there now will be described the steps involved in producing a certain type of semiconductor electrical translating device which is but one of many semiconductor devices to which the present invention method may be advantageously applied. For purposes of example only it will be assumed that the present invention lifetime control method is being applied to a high speed, high voltage planar silicon diode of a type well known to the art.

As shown in FIG. 1, a slice of 1½–2 inch diameter single crystal of n+ conductivity silicon 12 has deposited on one of its surfaces a layer of n-type conductivity epitaxial silicon 11. The parent crystal 12 has a thickness of from 10–14 mils, while the epitaxial region 11 is typically on the order of 1 mil in thickness.

Figure 1:
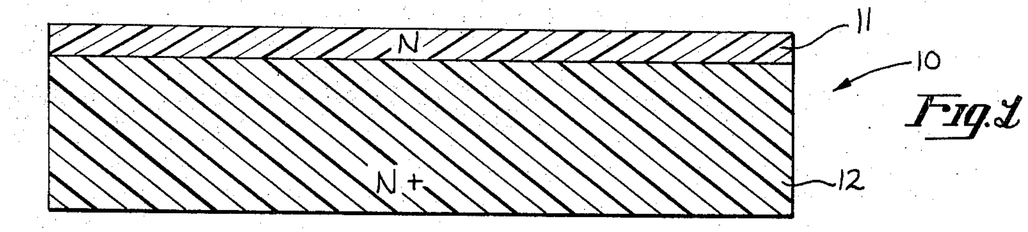
FIG. 1 is a greatly enlarged across-sectional view of a silicon wafer during an intermediate step in the production of a high switching speed, high voltage planar diode, to be processed in accordance with the presently preferred embodiment of the present invention.
Figure 2:
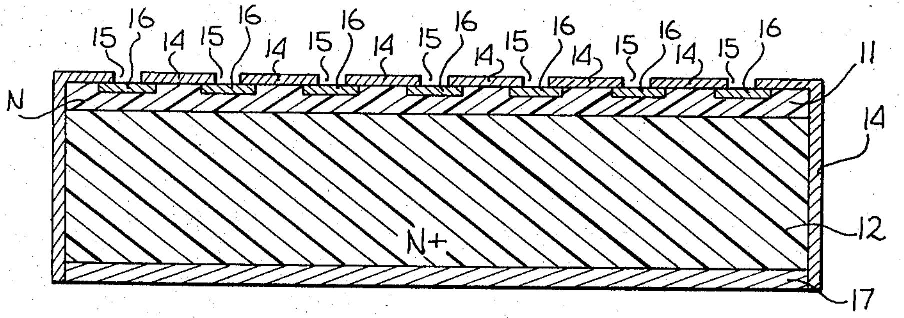
FIG. 2 is a cross-sectional view of the wafer of FIG. 1 during a subsequent step.
Figure 3:
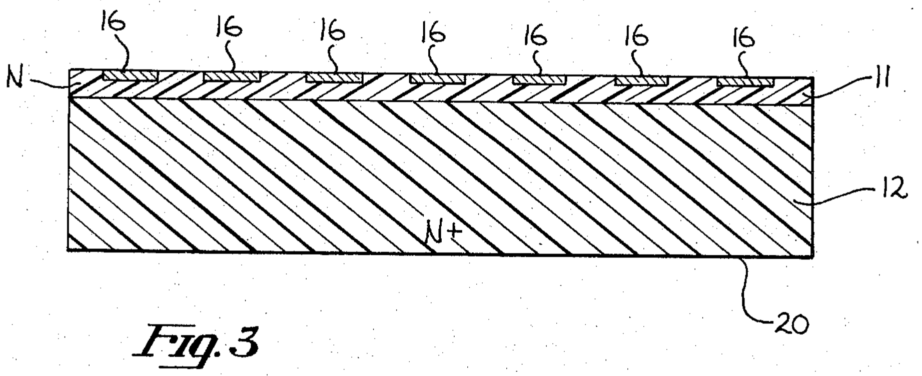
FIG. 3 is a cross-sectional view similar to FIG. 3 during a later step, employing the present invention method.

Next, the wafer 10 of FIG. 1 is treated in accordance with well known prior art techniques involving masking and photo exposure, depositing a layer of silicon dioxide ($SiO_2$) 14 over the surface of the wafer, the layer having numerous openings or windows 15 therein as shown in FIG. 2. Through the windows 15, a dopant such as boron is diffused into the epitaxial n-type silicon layer 11 forming regions of P+ conductivity 16. At the same time that P+ regions 16 are formed a P+ region 17 is formed on the opposite face of wafer 10. The source of boron for this step is commonly called diborane ($B_2H_6$). The back surface of the wafer 10 is then sandblasted removing the P+ region and exposing surface 20 of n+ conductivity silicon. The wafer is then ultrasonically cleaned and dried.

Hereafter a solution of platinum is prepared as follows: One gram of hexahydroxy platinic acid ($H_2P_t[OH]_6$) is dissolved into 130 cc. of anhydrous acetone at room temperature. Two drops of this solution (approximately 0.05 cc.) is dispersed on the n+ surface 20 of wafer 10.

The wafer is then allowed to dry. Placing the wafer in an oven maintained at 50–100° C. will facilitate the drying.

Next the wafer is heated to a temperature of 960° C. for 30 minutes. At this temperature the acid decomposes into platinum, water and oxygen and the platinum reacts with silicon on the wafer surface to form platinum silicide. Platinum atoms from the platinum silicide then diffuse into the body of wafer 10. If an excess of platinum atoms are available, that is if more than a certain minimum amount of hexahydroxy platinic acid is present, the number of platinum atoms which diffuse into the silicon wafer 10 is dependent only on the temperature since the solubility of platinum in silicon is a function of temperature.

After the platinum diffusion step the surfaces of the wafer are cleaned and prepared so as to receive contacts utilizing well-known prior art procedures.

The large wafer is then cut into a number of small wafers each containing one of the windows 15. The masking material 14 is removed from each small wafer as by sandblasting and contacts are attached to the P+ regions 16 and n+ regions 12 of each small wafer by using prior art methods. The resulting semiconductor device is completed by being put into a protective housing.

Figure 4:
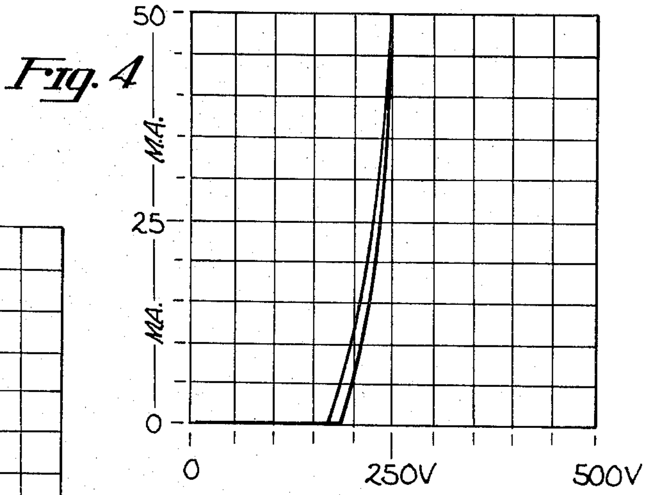
FIG. 4 is a graph showing a typical reverse current-reverse voltage cure of a fast switching diode constructed in accordance with a prior art lifetime control method.
Figure 5:
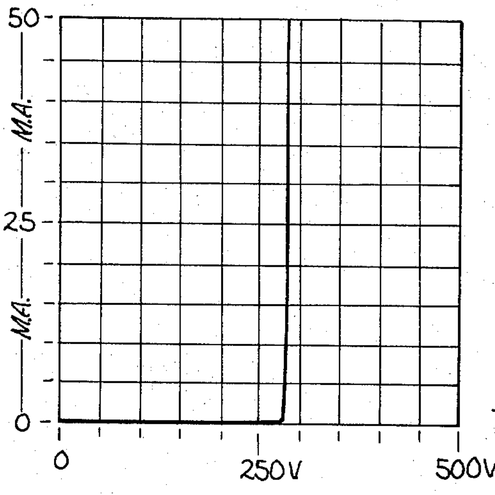
FIG. 5 is a graph showing a curve similar to FIG. 4 for a diode constructed in accordance with the present invention method.

FIG. 5 shows the reverse voltage characteristics of a typical device made in accordance with the described method. For comparison FIG. 4 shows the reverse voltage characteristics of a similar device except that gold is used as the minority carrier lifetime control agent. The gold was introduced in this device by prior art methods. It can be seen that the "knee" in the device made in accordance with the present invention is much sharper than the prior art device. The sharp knee is of great advantage in certain types of circuits as is well known to those skilled in the art.

It has been found that the reverse breakdown voltage is increased substantially in a device which has been doped with platinum by the method of this invention as compared to undoped devices. For example, in the specific example described above the breakdown voltage was about 150–200 v. higher than it would have been had no platinum been diffused into the device at all. The resistivity of the parent wafer was approximately 8 ohm cm. and the resultant breakdown voltage is 260 v. An undoped parent crystal processed in the same manner except for the introduction of the platinum minority carrier control agent would be expected to result in a device having a reverse breakdown voltage of 150–170 volts.

The reverse recovery time ($t_{rr}$) of a device made in accordance with the procedure of the present invention using a diffusion temperature of 960° C. is about 65 nanoseconds. Lower values of $t_{rr}$ can be achieved by using a higher diffusion temperature and conversely higher reverse recovery times result from lower diffusion temperatures.

Figure 6:
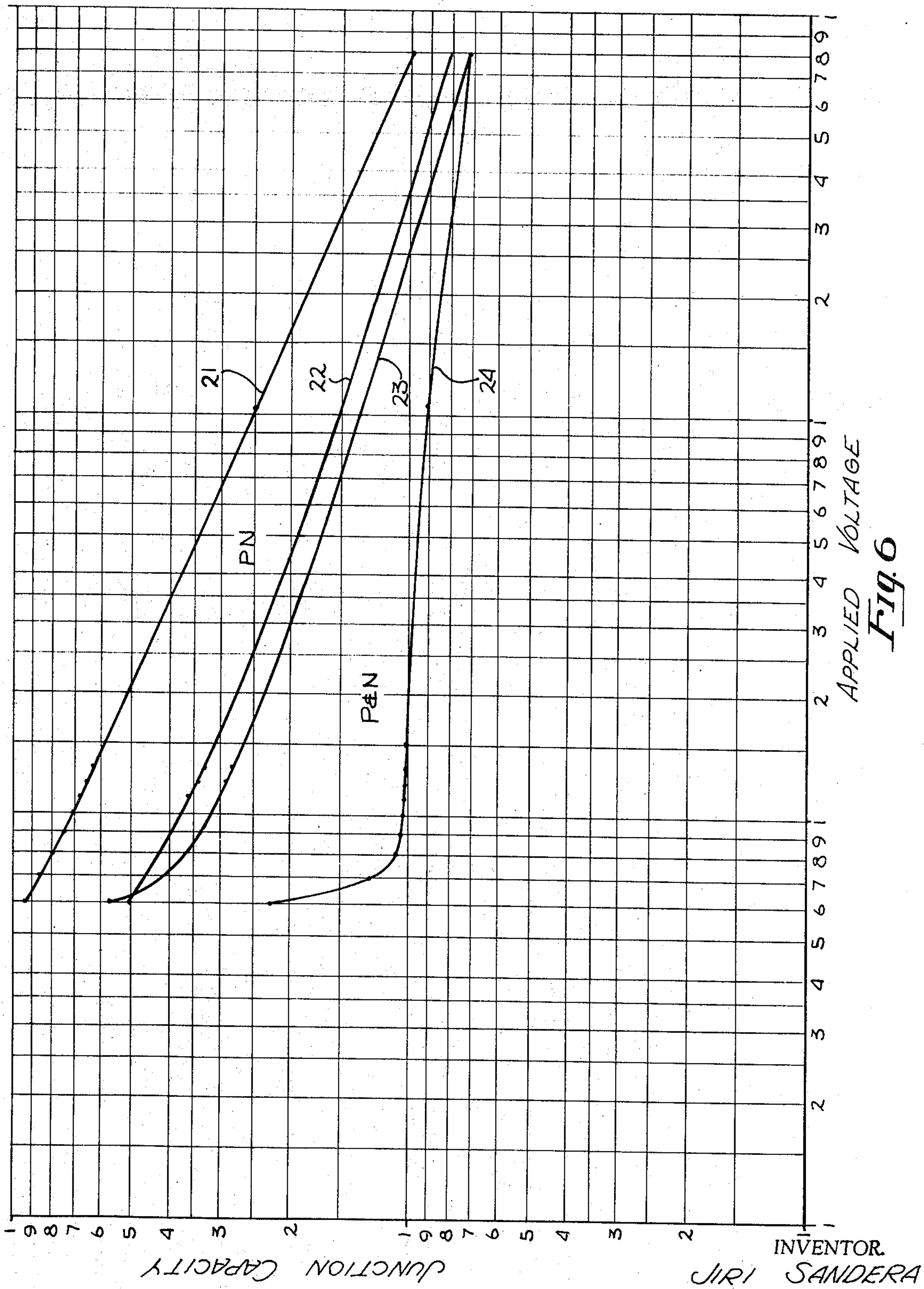
FIG. 6 is a graph showing a family of curves showing the capacitance vs. reverse voltage characteristics for several diodes constructed in accordance with the present invention method and prior art methods, as well.

FIG. 6 shows a comparison of the applied voltage-junction capacity characteristics of undoped (curve 21), platinum doped (curves 22 and 23), and gold doped (curve 24) devices. The platinum doped devices are made in accordance with the present invention while the undoped and gold doped are prior art devices. It can be seen that control of minority carrier lifetime by the method of the present invention does not destroy the voltage-capacity characteristic as does the prior art method (curve 24). It is thus possible to make a variable capacitor suitable for high frequency operation by the methods described herein.

The method of this invention has been described using a particular example for ease of explanation and clarity but it will be understood by those skilled in the art that other platinum bearing compounds, other solvents and semiconductor materials other than silicon, as for example, germanium, may be used as well as different temperatures and different diffusion times all within the scope of the present invention. The platinum compound used should be one which decomposes on heating forming platinum and preferably gaseous products or products which do not react with the semiconductor material being used in such a way as to interfere with the operation of the completed device. Some examples of suitable platinum compounds are: $P_tO_2$, $P_tO_4$, $P_tO$, $P_t[OH]_2 \cdot 2H_2O$, $P_{t2}O \cdot H_2O$, $P_{t2}O_3 \cdot 3H_2O$.

The solvent used may be selected mostly on the basis of convenience. The platinum compound should be soluble in it and should evaporate at a relatively low temperature. Examples of suitable solvents are: acetone, methanol, isopropyl alcohol, and methyl ethyl ketone.

The concentration of the solution should be such that a convenient amount of solution applied to the parent wafer will contain a sufficient number of platinum atoms to achieve the desired lifetime killing effect. If $H_2P_t[OH]_6$ is used approximately 100 times the number of atoms needed should be supplied. 0.05 cc. is a convenient amount of solution to cover the surface of a 1½ inch diameter wafer so that a satisfactory solution concentration would be 0.0005 gram/.05 cc. or 1.00 gram/100 cc.

The method of the present invention has been described using by way of example, a silicon diode; however, it will be obvious to those skilled in the art that the same method can be used for the manufacture of transistors or other semiconductor devices wherein it is desirable to reduce minority carrier lifetime. The method may be carried out either before or after junction formation. The process may also be carried out on a slice of semiconductor material, as described, or on a large crystal before slicing. The time required for platinum atoms to diffuse through a large piece of semiconductor material will of course be greater than is required of a thin slice.

I claim:

1. A process for introducing a minority carrier control agent into a semiconductor which comprises the steps of:

(a) dispersing a platinum bearing compound over a portion of the surface of a semiconductor, said platinum bearing compound being in solution; and (b) heating said semiconductor to a temperature which causes said platinum bearing compound to decompose and platinum from said compound to diffuse into the body of said semiconductor.

2. A process as recited in claim 1 wherein said semiconductor contains a p-n junction.

3. A process as recited in claim 2 and further including the step of evaporating the solvent of said solution thereby drying said semiconductor prior to the step of heating said semiconductor to diffusing temperature.

4. A process as recited in claim 2 wherein said semiconductor is silicon.

5. A process as recited in claim 2 wherein said platinum bearing compound is $H_2P_t[OH]_6$.

6. A process as recited in claim 5 wherein said semiconductor is silicon.

7. A process as recited in claim 5 wherein the solvent of said solution is acetone.

8. A process as recited in claim 5 wherein said solution contains approximately 1 gram $H_2P_t[OH]_6$ per 130 cc. acetone.

9. A process as recited in claim 1 wherein said platinum bearing compound is selected from the group consisting of $P_tO_2$, $P_tO_4$, $P_tO$, $P_t[OH]_2 \cdot 2H_2O$, $P_t2O \cdot H_2O$, $P_{t2}O_3 \cdot 3H_2O$, and $H_2P_t[OH]_6$.

10. A process as recited in claim 1 and further including the step of forming a p-n junction in said semiconductor after said heating step.

11. A process as recited in claim 10 wherein said platinum bearing compound is $H_2P_t[OH]_6$.

12. A process as recited in claim 10 wherein said semiconductor is silicon.

13. A process as recited in claim 12 wherein said platinum bearing compound is $H_2P_t[OH]_6$.

14. A process as recited in claim 1 wherein said semiconductor contains a p-n junction and said platinum bearing compound is selected from the group consisting of $P_tO_2$, $P_tO_4$, $P_tO$, $P_t[OH]_2 \cdot 2H_2O$, $P_{t2}O \cdot H_2O$, $P_{t2}O_3 \cdot 3H_2O$, and $H_2P_t[OH]_6$.

15. A process as recited in claim 1 wherein said platinum bearing compound is selected from the group consisting of $P_tO_2$, $P_tO_4$, $P_tO$, $P_t[OH]_2 \cdot 2H_2O$, $P_{t2}O \cdot H_2O$, $P_{t2}O_3 3H_2O$, and $H_2P_t[OH]_6$, and further including the forming a p-n junction in said semiconductor after said heating step.

References Cited

UNITED STATES PATENTS

| | | | |
|---|---|---|---|
| 3,473,976 | 10/1969 | Castrucci et al. | 148—175 |
| 3,389,024 | 6/1968 | Schimmer | 148—188 |
| 3,486,951 | 12/1969 | Norby | 148—188 |
| 3,640,783 | 2/1972 | Bailey | 148—186 |
| 3,660,156 | 5/1972 | Schmidt | 148—188 X |
| 3,067,485 | 12/1962 | Ciccolella et al. | 148—186 |

FOREIGN PATENTS

| | | | |
|---|---|---|---|
| 25,292 | 10/1969 | Japan | 317—235 AQ |

OTHER REFERENCES

Carchano et al.: "Electrical Properties of Silicon Doped With Platinum," Soild-State Electronics, vol. 13, pp. 83–9, 1970.

GEORGE T. OZAKI, Primary Examiner

U.S. Cl. X.R.

148—186, 187; 117—201; 252—62.3 E; 317—235 R